United States Patent
Higashiyama

(10) Patent No.: US 9,053,406 B2
(45) Date of Patent: Jun. 9, 2015

(54) ANTENNA CIRCUIT CONSTITUENT BODY FOR IC CARD/TAG AND METHOD FOR MANUFACTURING THE SAME

(75) Inventor: Hiroki Higashiyama, Osaka (JP)

(73) Assignee: TOYO ALUMINIUM KABUSHIKI KAISHA, Osaka (JP)

( * ) Notice: Subject to any disclaimer, the term of this patent is extended or adjusted under 35 U.S.C. 154(b) by 224 days.

(21) Appl. No.: 13/702,983

(22) PCT Filed: Jun. 6, 2011

(86) PCT No.: PCT/JP2011/062903
§ 371 (c)(1),
(2), (4) Date: Dec. 7, 2012

(87) PCT Pub. No.: WO2011/162088
PCT Pub. Date: Dec. 29, 2011

(65) Prior Publication Data
US 2013/0082882 A1    Apr. 4, 2013

(30) Foreign Application Priority Data

Jun. 25, 2010  (JP) .................................. 2010-145078

(51) Int. Cl.
| | |
|---|---|
| *H01Q 1/36* | (2006.01) |
| *G06K 19/077* | (2006.01) |
| *H01Q 1/38* | (2006.01) |
| *H01Q 1/22* | (2006.01) |
| *H01Q 7/00* | (2006.01) |
| *H05K 3/46* | (2006.01) |

(52) U.S. Cl.
CPC .... *G06K 19/07775* (2013.01); *G06K 19/07718* (2013.01); *G06K 19/07773* (2013.01); *H05K 3/4685* (2013.01); *H01Q 1/38* (2013.01); *H01Q 1/2225* (2013.01); *H01Q 7/00* (2013.01); *G06K 19/07783* (2013.01)

(58) Field of Classification Search
None
See application file for complete search history.

(56) References Cited

U.S. PATENT DOCUMENTS 5,598,032 A * 1/1997 Fidalgo ........................ 257/679
6,049,461 A * 4/2000 Haghiri-Tehrani et al. ... 361/737
(Continued)

FOREIGN PATENT DOCUMENTS

| CN | 101548287 A | 9/2009 |
|---|---|---|
| JP | 2001-92936 A | 4/2001 |

(Continued)

*Primary Examiner* — Trinh Dinh
(74) *Attorney, Agent, or Firm* — Birch, Stewart, Kolasch & Birch, LLP

(57) ABSTRACT

Provided are an antenna circuit constituent body for an IC card/tag capable of reducing environmental load in a manufacturing process for joining both end portions of an antenna circuit pattern layer and capable of enhancing reliability of joined portions of the both end portions of the antenna circuit pattern layer: and a method for manufacturing the antenna circuit constituent body for an IC card/tag. In the antenna circuit constituent body for an IC card/tag, an insulating layer (107) is formed so as to extend from an upper part of a first circuit pattern layer part (103), via an upper part of a third circuit pattern layer part (101), and to an upper part of a second circuit pattern layer part (104). A conductive layer (108) is formed on the insulating layer (107) so as to bring the first circuit pattern layer part (103) and the second circuit pattern layer part (104) into conduction. The insulating layer (107) has a plurality of inclined end surfaces on each of the first circuit pattern layer part (103) and the second circuit pattern layer part (104).

5 Claims, 6 Drawing Sheets

(56) References Cited

U.S. PATENT DOCUMENTS

| | | | |
|---|---|---|---|
| 6,353,420 B1 * | 3/2002 | Chung | 343/895 |
| 6,459,588 B1 * | 10/2002 | Morizumi et al. | 361/737 |
| 2002/0015002 A1 | 2/2002 | Yasukawa et al. | |
| 2005/0072595 A1 | 4/2005 | Cho | |
| 2006/0164321 A1 | 7/2006 | Mathieu et al. | |
| 2013/0082882 A1 * | 4/2013 | Higashiyama | 343/700 MS |

FOREIGN PATENT DOCUMENTS

| | | |
|---|---|---|
| JP | 2001-202489 A | 7/2001 |
| JP | 2002-7990 A | 1/2002 |
| JP | 2004-140587 A | 5/2004 |
| JP | 2005-109505 A | 4/2005 |
| JP | 2006-518137 A | 8/2006 |
| JP | 2008-269161 A | 11/2008 |
| JP | 2010-28706 A | 2/2010 |

\* cited by examiner

RELATED ART

ANTENNA CIRCUIT CONSTITUENT BODY FOR IC CARD/TAG AND METHOD FOR MANUFACTURING THE SAME

TECHNICAL FIELD

The present invention relates generally to an antenna circuit constituent body for an IC card/tag and a method for manufacturing the antenna circuit constituent body for an IC card/tag, and in particular, to an antenna circuit constituent body for an IC card/tag, which is equipped with an antenna circuit for RFID (Radio Frequency Identification) typified by a contactless IC card, an anti-shoplifting sensor, and the like, and a method for manufacturing the above-mentioned antenna circuit constituent body for an IC card/tag.

BACKGROUND ART

In recent years, remarkable development of a functional card such as an IC tag and an IC card has been achieved, and the functional card has come into use in an anti-theft tag, a tag for checking those coming in and out, a telephone card, a credit card, a prepaid card, a cash card, an ID card, a card key, a variety of membership cards, a bookstore gift card, a patient registration card, a commuter pass, and the like. Each of these antenna circuit constituent bodies for the functional cards is constituted of: a base material formed of a resin film such as a polypropylene (PP) film and a polyethylene terephthalate (PET) film; and an antenna circuit pattern layer formed of metal foil of aluminum foil or copper foil, which is formed on a surface of the base material. The metal foil is bonded on one side or both sides of the base material with an adhesive interposed therebetween by employing a dry laminate method or the like, and thereafter, the metal foil is subjected to etching processing, thereby forming the antenna circuit pattern layer on the surface of the base material.

The conventional antenna circuit constituent body having the above-mentioned configuration and the conventional method for manufacturing the antenna circuit constituent body are disclosed in Japanese Patent Application Laid-Open Publication No. 2002-7990 (Patent Literature 1) and Japanese Patent Application Laid-Open Publication No. 2004-140587 (Patent Literature 2).

In the conventional antenna circuit constituent body for RFID, in general, pattern layers of a circuit are formed on both surfaces of a base material formed of a resin film. On one of the surfaces of the base material, a coiled pattern layer of an antenna circuit is formed. This pattern layer of the antenna circuit corresponds to a coil of an electronic circuit, also plays a role of an antenna receiving electromagnetic waves, and is referred to as the so-called coil pattern. On the other of the surfaces of the base material on a side opposite to the side on which the coiled circuit pattern layer is formed, a pattern layer of a circuit playing a role of a jumper of the above-mentioned antenna circuit is formed. This pattern layer of the circuit is referred to as the so-called bridge circuit pattern layer.

In the above-described antenna circuit constituent body, as a method of electrically connecting the antenna circuit pattern layer formed on the one of the surfaces of the base material and the bridge circuit pattern layer formed on the other of the surfaces of the base material, the below-described methods are available.

(1) On a side of a base material, opposite to a side thereof on which an antenna circuit pattern layer is formed, a bridge circuit pattern layer is formed. At respective portions of both end portions of the antenna circuit pattern layer and both end portions of the bridge circuit pattern layer, which are to be joined, through-holes are formed. The through-holes are filled with a plating material or a silver coating material, thereby connecting the both end portions of the antenna circuit pattern layer and the both end portions of the bridge circuit pattern layer.

(2) As disclosed in Japanese Patent Application Laid-Open Publication No. 2002-7990 (Patent Literature 1) and Japanese Patent Application Laid-Open Publication No. 2004-140587 (Patent Literature 2), on a side of a base material, opposite to a side thereof on which an antenna circuit pattern layer is formed, a bridge circuit pattern layer is formed. By means of a crimping process, respective portions of both end portions of the antenna circuit pattern layer formed on the one side of the base material and both end portions of the bridge circuit pattern layer formed on the opposite other side of the base material are connected. Here, the crimping process is conducted, for example, such that by means of ultrasonic waves or the like, at least portions of circuit pattern layers formed on both surfaces of the base material, with an adhesive interposed therebetween, are pressed against each other, thereby partially destroying resins constituting the adhesive, the base material, and the like and causing the portions of the circuit pattern layers on the both sides to physically contact each other.

(3) As disclosed in Japanese Patent Application Laid-Open Publication No. 2008-269161 (Patent Literature 3), on a side of a base material, opposite to a side thereof on which an antenna circuit pattern layer is formed, a bridge circuit pattern layer is formed. By means of resistance welding, the antenna circuit pattern layer formed on the one side of the base material and the bridge circuit pattern layer formed on the opposite other side of the base material are connected. In this case, in a state where welding electrodes are caused to contact a front side and a back side of a circuit pattern layer and a pressure is exerted thereon, heating is conducted by applying a predetermined current to the welding electrodes, thereby fusing one portion of the base material interposed between the front side of the circuit pattern layer and the back side of the circuit pattern layer and also causing portions of the front side of the circuit pattern layer and the back side of the circuit pattern layer, which face each other, to contact each other. To the portions of the circuit pattern layers on the front side and the back side, which have been caused to contact each other, a predetermined welding current is applied, thereby joining the portions of the circuit pattern layers on the front side and the back side which face each other.

In the antenna circuit constituent body, as a method of electrically connecting both end portions of the antenna circuit pattern layer formed on the one of the surfaces of the base material without forming the bridge circuit pattern layer on the other of the surfaces of the base material, the below-described methods are available.

(4) As disclosed in Japanese Patent Application Laid-Open Publication No. 2001-92936 (Patent Literature 4) and Japanese Patent Application Laid-Open Publication No. 2005-109505 (Patent Literature 5), an antenna circuit pattern layer is formed on one of surfaces of a base material, an insulating layer is formed by applying an insulating resin onto one portion of the antenna circuit pattern layer, which intersects a jumper circuit pattern layer, and a conducting substance such as a silver paste is applied onto the insulating layer so as to electrically connect portions to be joined at both end portions of the antenna circuit pattern layer, thereby forming the jumper circuit pattern layer.

(5) As disclosed in Japanese Patent Application Laid-Open Publication No. 2010-28706 (Patent Literature 6), respective tips of one end portion and the other end portion of a conductive linear body are stuck through both respective end portions of an antenna circuit pattern layer, which are to be electrically connected, from the other surface of a base material so as to penetrate through the base material and the antenna circuit pattern layer formed on one surface of the base material, thereby extending a central portion of the linear body on the other surface of the base material, disposing the one end portion of the linear body on a surface of one end portion of the antenna circuit pattern layer, and disposing the other end portion of the linear body on a surface of the other end portion of the antenna circuit pattern layer.

CITATION LIST

Patent Literature

Patent Literature 1: Japanese Patent Application Laid-Open Publication No. 2002-7990
Patent Literature 2: Japanese Patent Application Laid-Open Publication No. 2004-140587
Patent Literature 3: Japanese Patent Application Laid-Open Publication No. 2008-269161
Patent Literature 4: Japanese Patent Application Laid-Open Publication No. 2001-92936
Patent Literature 5: Japanese Patent Application Laid-Open Publication No. 2005-109505
Patent Literature 6: Japanese Patent Application Laid-Open Publication No. 2010-28706

SUMMARY OF THE INVENTION

Technical Problem

In each of the methods (1), (2), and (3), in order to electrically connect both end portions of the antenna circuit pattern layer, the bridge circuit pattern layer is formed on the other surface side of the base material. The bridge circuit pattern layer is formed by etching metal foil fixed on the other surface side of the base material by means of an adhesive. At this time, most of the metal foil attached on the surface of the base material is removed by etching processing. Therefore, the great part of the metal foil has gone to waste, thereby causing problems in that not only a manufacturing cost is increased but also productivity is low because most of the metal foil is removed by the etching processing. In addition, not only it is required to separately attach the metal foil fixedly on the other surface side of the base material only for the purpose of forming the bridge circuit pattern layer, but also it is required to subject the metal foil to the etching processing. Therefore, an extra amount of an etching liquid is needed, and furthermore, caused is a problem in that a large amount of a waste liquid including metal ions, produced by the etching processing, is produced. As a result, a problem in that environmental load is increased is caused.

In the method (4), unlike in the methods (1), (2), and (3), it is not required to subject metal foil, fixed onto the other surface side of the base material separately, to the etching processing only for the purpose of forming a bridge circuit pattern layer, thus allowing the environmental load to be reduced. However, when a thickness of the antenna circuit pattern layer is increased, a thickness of the insulating layer is increased in order to ensure insulating properties. Therefore, differences in heights of the jumper circuit pattern layer are increased. This causes a problem in that when the antenna circuit constituent body is conveyed after forming the jumper circuit pattern layer, cracks in the jumper circuit pattern layer are caused, thereby leading to disconnection. As a result, in terms of reliability, there is a problem.

In addition, in the method (5), unlike in the methods (1), (2), and (3), it is not required to subject metal foil, fixed onto the other surface side of the base material separately, to the etching processing only for the purpose of forming a bridge circuit pattern layer, thus allowing the environmental load to be reduced. However, there are problems, for example, in that the tips of the end portions of the conductive linear body lack flexibility, and when the antenna circuit constituent body is conveyed after the processing, the tips of the end portions of the linear body move, thereby breaking the antenna circuit pattern layer. As a result, in terms of reliability, there is a problem.

Therefore, an object of the present invention is to provide an antenna circuit constituent body for an IC card/tag capable of reducing environmental load in a manufacturing process for joining both end portions of an antenna circuit pattern layer and of enhancing reliability of joining portions of the both end portions of the antenna circuit pattern layer and a method for the antenna circuit constituent body for an IC card/tag.

Solution To Problem

An antenna circuit constituent body for an IC card/tag according to the present invention includes: a base material formed of a resin film; and an antenna circuit pattern layer formed on one surface of the base material and constituted of a conductive body including metal as a main component. The antenna circuit pattern layer includes: a first circuit pattern layer part and a second circuit pattern layer part electrically connected to each other; and a third circuit pattern layer part formed on one surface of a region of the base material between the first and second circuit pattern layer parts. Furthermore, the antenna circuit constituent body for an IC card/tag according to the present invention includes: an insulating layer formed so as to extend from an upper part of the first circuit pattern layer part, via an upper part of the third circuit pattern layer part, to an upper part of the second circuit pattern layer part; and a conductive layer formed on the insulating layer so as to bring the first circuit pattern layer part and the second circuit pattern layer part into conduction. The insulating layer has a plurality of inclined end surfaces on each of the first circuit pattern layer part and the second circuit pattern layer part.

In the antenna circuit constituent body for an IC card/tag according to the present invention, it is not required to subject metal foil, fixed onto the other surface side of the base material separately, to etching processing only for the purpose of forming a conductive layer as a bridge circuit pattern layer, thus allowing environmental load to be reduced.

In addition, since the insulating layer has the plurality of inclined end surfaces on each of the first circuit pattern layer part and second circuit pattern layer part, the inclination of the end part of the insulating layer can be made gentle. Thus, a problem in that when the antenna circuit constituent body is conveyed after forming the conductive layer, cracks are caused in the conductive layer and disconnection thereby occurs can be solved. As a result, it is made possible to enhance reliability of joining portions of both end portions of the antenna circuit pattern layer.

In the antenna circuit constituent body for an IC card/tag according to the present invention, it is preferable that the insulating layer has a split-level portion on each of the first circuit pattern layer part and the second circuit pattern layer part.

In addition, in the antenna circuit constituent body for an IC card/tag according to the present invention, it is preferable that the insulating layer includes: a central portion formed on the third circuit pattern layer part and having a relatively large thickness; and both end portions formed respectively on the first circuit pattern layer part and the second circuit pattern layer part and each having a relatively small thickness.

Furthermore, in the antenna circuit constituent body for an IC card/tag according to the present invention, it is preferable that the insulating layer is formed of a polyester resin.

In the antenna circuit constituent body for an IC card/tag according to the present invention, it is preferable that the antenna circuit pattern layer is formed of copper foil, the antenna circuit pattern layer and the base material are thermally bonded with an adhesive layer interposed therebetween, and the conductive layer includes silver.

A method for manufacturing an antenna circuit constituent body for an IC card/tag, according to the present invention, includes the following steps.

(a) A step of fixedly attaching metal foil on one surface of a base material formed of a resin film.

(b) A step of printing on the metal foil a resist ink layer having a predetermined pattern.

(c) A step of forming on the one surface of the base material an antenna circuit pattern layer through etching the metal foil by using the resist ink layer as a mask, the antenna circuit pattern layer including a first circuit pattern layer part and a second circuit pattern layer part electrically connected to each other and a third circuit pattern layer part formed on one surface of a region of the base material between the first and second circuit pattern layer parts.

(d) A step of forming a first insulating layer part so as to extend from an upper part of the first circuit pattern layer part, via an upper part of the third circuit pattern layer part, to an upper part of the second circuit pattern layer part.

(e) A step of forming a second insulating layer part on the first insulating layer part so as to expose one part of a surface of the first insulating layer part formed on each of the first circuit pattern layer part and the second circuit pattern layer part.

(f) A step of forming on the first and second insulating layer parts a conductive layer bringing the first circuit pattern layer part and the second circuit pattern layer part into conduction.

Advantageous Effects of the Invention

As described above, according to the present invention, it is made possible to reduce environmental load in a manufacturing process for joining both end portions of an antenna circuit pattern layer and to enhance reliability of joining portions of the both end portions of the antenna circuit pattern layer.

DESCRIPTION OF EMBODIMENTS

Hereinafter, an embodiment of the present invention will be described with reference to the accompanying drawings.

Figure 1:
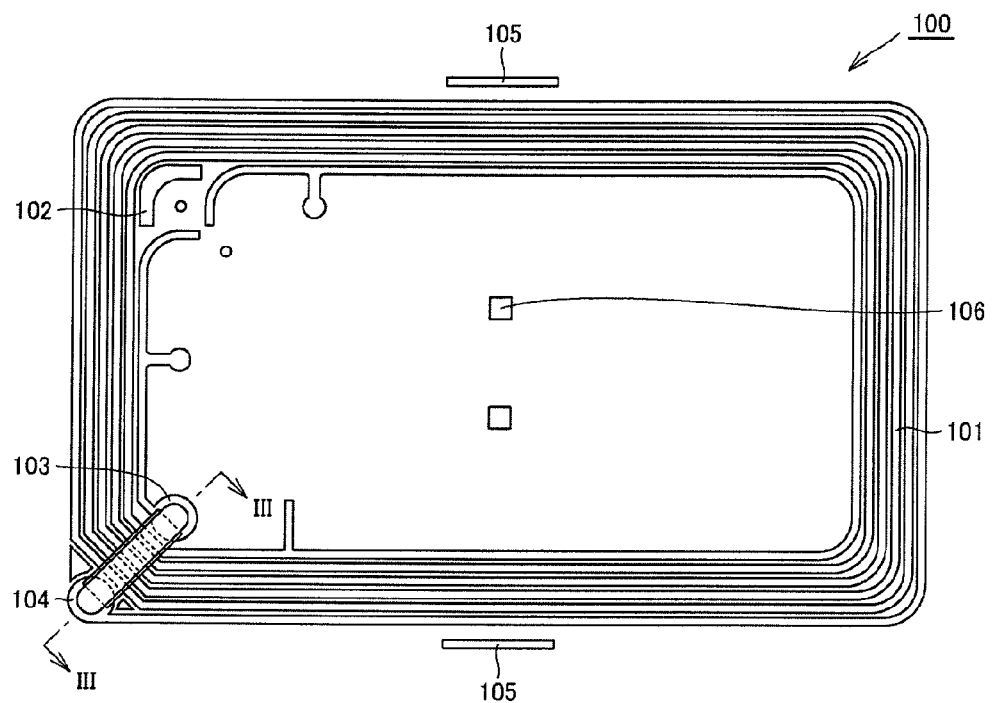
FIG. 1 is a plan view of an antenna circuit constituent body for an IC card/tag, according to one embodiment of the present invention.
Figure 2:
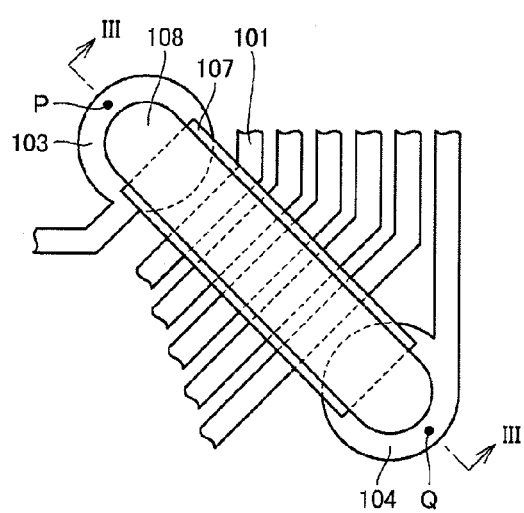
FIG. 2 is a partially enlarged plan view illustrating one part of FIG. 1 in an enlarged manner.
Figure 3:
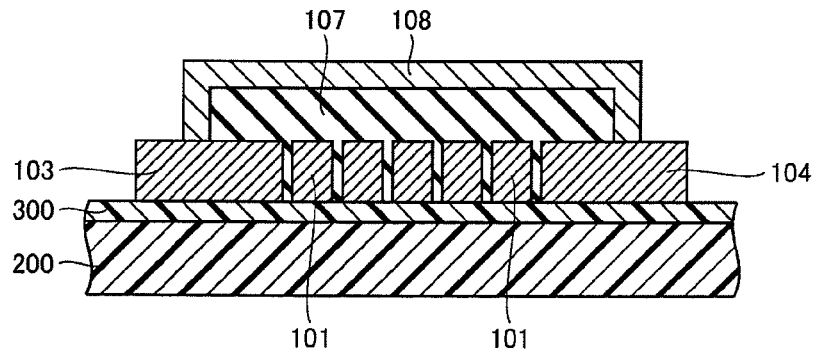
FIG. 3 is a schematic partial cross-sectional view taken from a line III-III of each of FIG. 1 and FIG. 2.

As shown in FIG. 1 through FIG. 3, an antenna circuit constituent body for an IC card/tag is constituted of: a base material 200 formed of a resin film including a resin; and an antenna circuit pattern layer 100 formed of copper foil including copper as a main component and formed on one surface of the base material 200 in accordance with a predetermined pattern with an adhesive layer 300 interposed therebetween.

As shown in FIG. 1, the antenna circuit pattern layer 100 is constituted of: an antenna coil part 101 formed in a spiral pattern on one surface of the base material; an IC chip mounting part 102; a first circuit pattern layer part 103 and a second circuit pattern layer part 104 which are formed so as to connect to end portions of the antenna coil part 101; a slitter line mark part 105; and sensor mark parts 106. In an end portion on a side of an inner periphery of the antenna coil part 101, a region for connecting wires to an IC chip (not shown) is formed, and in the vicinity of the end portion, the IC chip mounting part 102 is formed. By mounting the IC chip on the IC chip mounting part 102, the first circuit pattern layer part 103 is electrically connected to the end portion on the side of the inner periphery of the antenna coil part 101. The second circuit pattern layer part 104 is electrically connected to an end portion on a side of an outer periphery of the antenna coil part 101. In a region outside the antenna coil part 101 and in a space between the antenna circuit pattern layer 100 and another neighboring circuit pattern layer (not shown in FIG. 1), the slitter line mark part 105 is formed, in a line-like pattern, of copper foil as similarly to the antenna circuit pattern layer 100 in order to indicate a position in which each antenna coil constituent body is divided and separated. Inside the antenna coil part 101, the sensor mark parts 106 for confirming a sensor position are formed, in an island-like manner, of the copper foil as similarly to the antenna circuit pattern layer 100.

As shown in FIG. 2 and FIG. 3, in a region of the base material 200 between the first circuit pattern layer part 103 and the second circuit pattern layer part 104, a third circuit pattern layer part as one part of a plurality of linear pattern layers constituting the antenna coil part 101 is disposed. The insulating layer 107 is formed so as to extend from an upper part of the first circuit pattern layer part 103, via an upper part of the third circuit pattern layer part (the one part of the plurality of linear pattern layers constituting the antenna coil part 101), to an upper part of the second circuit pattern layer part 104. In other words, the insulating layer 107 is formed so as to be laid across the upper part of the third circuit pattern layer part (the one part of the plurality of linear pattern layers constituting the antenna coil part 101) and on one part of the first circuit pattern layer part 103 and the second circuit pattern layer part 104. In addition, the insulating layer 107 is formed so as to fill interstices of the linear pattern layer part constituting the antenna coil part 101. The conductive layer 108 is formed on the insulating layer 107 so as to bring the first circuit pattern layer part 103 and the second circuit pattern layer part 104 into conduction. Although the insulating layer 107 is schematically illustrated in FIG. 3, a specific shape thereof will be described later.

It is preferable that a thickness of the copper foil used for forming the antenna circuit pattern layer 100 is greater than or equal to 9 μm and less than or equal to 50 μm. If the thickness of the copper foil is less than 9 μm, a large number of pinholes may be caused and a rupture may take place in the manufacturing process. On the other hand, if the thickness of the copper foil exceeds 50 μm, it takes time to conduct etching processing for forming the antenna circuit pattern layer 100 and an increase in material costs is incurred. The copper foil may be manufactured by employing either rolling or electrolysis. Metal foil other than the copper foil may be used to form the antenna circuit pattern layer 100.

It is preferable that the resin film used as the base material 200 of the antenna circuit constituent body for an IC card/tag according to the present invention is at least one kind selected from polyethylene terephthalate (PET) film, polyethylene naphthalate (PEN) film, and the like.

It is preferable that a thickness of this resin film is within a range of greater than or equal to 15 μm and less than or equal to 50 μm and it is more preferable that the thickness thereof is within a range of greater than or equal to 20 μm and less than or equal to 40 μm. If a thickness of the base material 200 is less than 15 μm, because stiffness of a laminated body with the copper foil for forming the antenna circuit pattern layer is insufficient, a problem associated with workability in each manufacturing process arises. On the other hand, if the thickness of the base material exceeds 50 μm, a thickness and a weight of an IC card/tag may be excessive.

For adhesion between the copper foil which is used for forming the antenna circuit pattern layer 100 and the resin film as the base material 200, it is preferable to employ a dry-lamination process utilizing a polyurethane (PU)-based adhesive containing an epoxy resin. As the polyurethane-based adhesive containing the epoxy resin, AD506, AD503, or AD76-P1 manufactured by Toyo-Morton Ltd., or the like can be adopted. As a hardening agent, CAT-10 manufactured by Toyo-Morton Ltd. can be adopted, and it may be required to use a mixture of the adhesive and the hardening agent with a mixing ratio of the adhesive:the hardening agent being 2 through 12:1. In a case where a general polyurethane-based adhesive not containing the epoxy resin is used, while etching processing for forming the circuit pattern layers is being conducted or when mounting of an IC chip is being conducted, delamination (peeling) may easily occur. This is because the polyurethane-based adhesive not containing the epoxy resin is inferior in chemical resistance and heat resistance.

In order to cause the copper foil 110, used for forming the antenna circuit pattern layer 100, to adhere onto the resin film as the base material 200, it is preferable to apply approximately 1 through 15 g/m$^2$, as a post-drying weight, of the polyurethane-based adhesive containing the epoxy resin. If this application amount is less than 1 g/m$^2$, an adhesion force of the copper foil is insufficient, and if the application amount exceeds 15 g/m$^2$, an increase in a manufacturing cost is incurred.

As the insulating layer 107, a resin, such as a polyimide resin, an epoxy resin, a polyester resin, a phenol resin, a urethane resin, and an acrylic resin, which is cured by heating whose degree does not impair properties of the resin film and the adhesive, can be used. The polyester resin is preferable.

It is preferable that a thickness of the insulating layer 107 (a thickness of the insulating layer 107 formed on the first circuit pattern layer part 103 and the second circuit pattern layer part 104) is within a range of greater than or equal to 10 μm and less than or equal to 100 μm. If the thickness of the insulating layer 107 is less than 10 μm, an insulation effect is not sufficient. On the other hand, if the thickness of the insulating layer 107 exceeds 100 μm, not only the formation of the insulating layer 107 is difficult, but also it is likely that the formation of the conductive layer 108 is hindered.

As a material of the conductive layer 108, a gold paste, a silver paste, a copper paste, an aluminum paste, a nickel paste, a conducting high polymer, and the like are cited, and the silver paste excellent in electrical conductivity is suitably used.

It is preferable that a thickness of the conductive layer 108 is within a range of greater than or equal to 1 μm and less than or equal to 50 μm. If the thickness of the conductive layer 108 is less than 1 μm, a conduction effect is not sufficient. On the other hand, if the thickness of the conductive layer 108 exceeds 50 μm, flexibility is reduced, whereby it is likely that the conductive layer 108 peels off or crack disconnection occurs.

Next, one embodiment of a method for manufacturing an antenna circuit constituent body for an IC card/tag, according to the present invention, will be described. Each of FIG. 4 through FIG. 8 shows a partial cross-sectional view taken from a direction of a line of FIG. 1 and FIG. 2.

Figure 4:
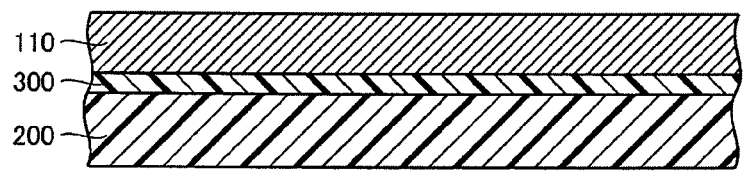
FIG. 4 is a schematic partial cross-sectional view illustrating a first step of manufacturing the antenna circuit constituent body for an IC card/tag according to the one embodiment of the present invention.

As shown in FIG. 4, an adhesive layer 300 is formed on the one surface of the base material 200 formed of the resin film, and the copper foil 110 is fixed on the one surface of the base material 200 by this adhesive layer 300. In this way, a laminated body constituted of the copper foil 110 and the base material 200 is prepared.

Figure 5:
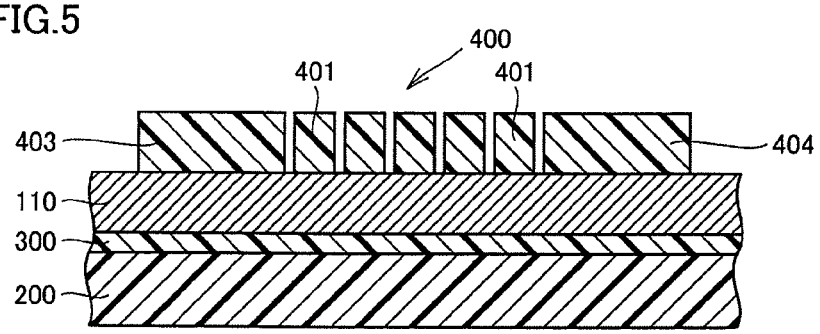
FIG. 5 is a schematic partial cross-sectional view illustrating a second step of manufacturing the antenna circuit constituent body for an IC card/tag according to the one embodiment of the present invention.
Figure 6:
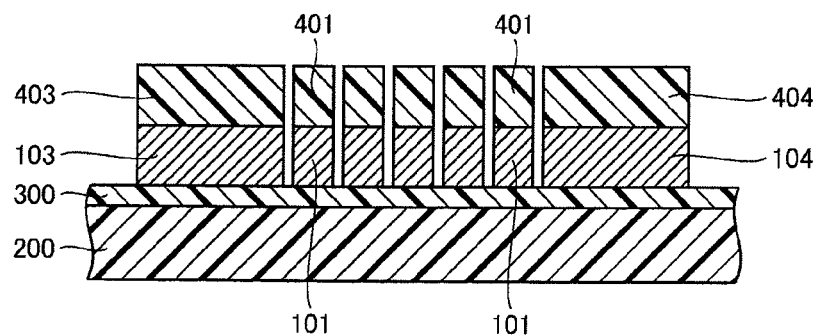
FIG. 6 is a schematic partial cross-sectional view illustrating a third step of manufacturing the antenna circuit constituent body for an IC card/tag according to the one embodiment of the present invention.

As shown in FIG. 5, a resist ink layer 400 is printed onto a surface of the copper foil 110 so as to have a predetermined spiral pattern in accordance with the specification of the antenna coil. After the printing, cure treatment for the resist ink layer 400 is conducted.

The copper foil 110 is etched by using the resist ink layer 400 as a mask, thereby forming the antenna circuit pattern layer 100 (FIG. 1). In the cross section shown in FIG. 6, it is illustrated that the antenna coil part 101, the first circuit pattern layer part 103, and the second circuit pattern layer part 104 are formed.

Figure 7:
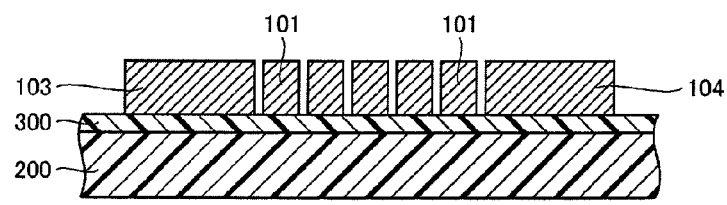
FIG. 7 is a schematic partial cross-sectional view illustrating a fourth step of manufacturing the antenna circuit constituent body for an IC card/tag according to the one embodiment of the present invention.

As shown in FIG. 7, resist ink layers 401, 403, and 404 are exfoliated.

Figure 8:
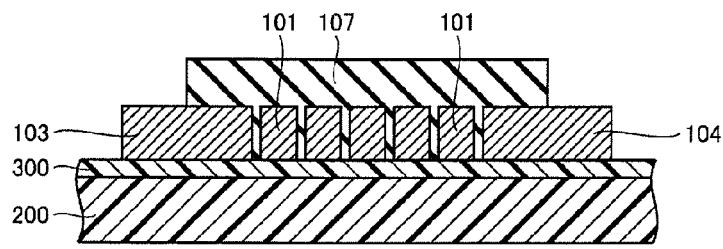
FIG. 8 is a schematic partial cross-sectional view illustrating a fifth step of manufacturing the antenna circuit constituent body for an IC card/tag according to the one embodiment of the present invention.

Thereafter, as shown in FIG. 8, the insulating layer 107 is formed so as to extend from the upper part of one part of the surface of the first circuit pattern layer part 103, be laid across the one part of the plurality of linear pattern layers constituting the antenna coil part 101, and reach the upper part of one part of the surface of the second circuit pattern layer part 104. Furthermore, as shown in FIG. 3, the conductive layer 108 is formed on the insulating layer 107 so as to bring the first circuit pattern layer part 103 and the second circuit pattern layer part 104 into conduction. As described above, the antenna circuit constituent body for an IC card/tag according to the present invention is completed.

Figure 10:
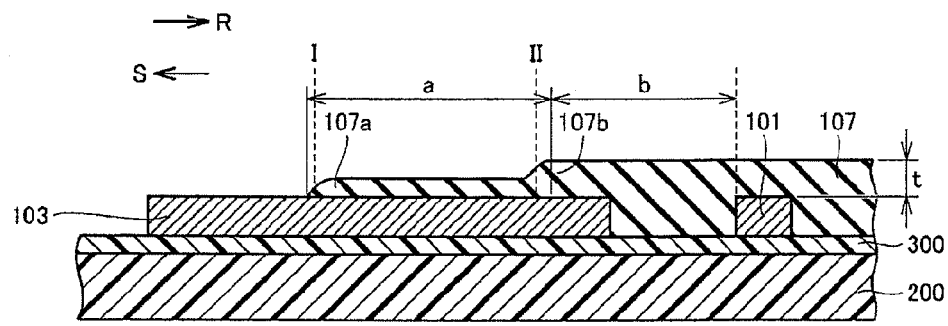
FIG. 10 is a partially enlarged cross-sectional view illustrating a second application step for forming the insulating layer in the method for manufacturing the antenna circuit constituent body for an IC card/tag, according to the one embodiment of the present invention.
Figure 11:
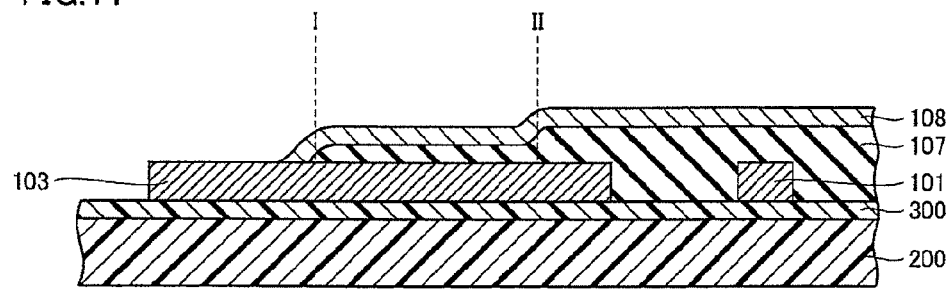
FIG. 11 is a partially enlarged cross-sectional view illustrating an application step for forming a conductive layer in the method for manufacturing the antenna circuit constituent body for an IC card/tag, according to the one embodiment of the present invention.

An insulating layer formation step shown in FIG. 8 and a conductive layer formation step shown in FIG. 3 will be specifically described with reference to FIG. 9 through FIG. 11. Each of FIG. 9 through FIG. 11 is a partially enlarged cross-sectional view illustrating a part on a left side of each of FIG. 8 and FIG. 3 in an enlarged manner.

Figure 9:
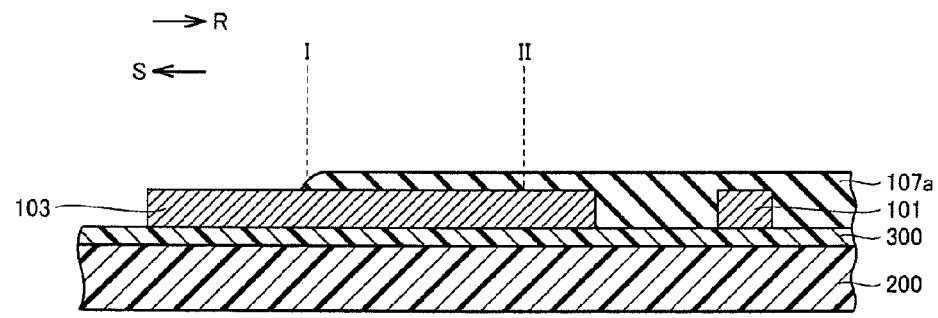
FIG. 9 is a partially enlarged cross-sectional view illustrating a first application step for forming an insulating layer in a method for manufacturing the antenna circuit constituent body for an IC card/tag, according to one embodiment of the present invention.

In the insulating layer formation step shown in FIG. 8, first, as shown in FIG. 9, the resin paste is applied by employing a screen printing method from a position I on the first circuit pattern layer part 103 in a direction indicated by an arrow R, thereby forming a first insulating layer part 107a. Thereafter, as shown in FIG. 10, the resin paste is applied onto the first insulating layer part 107a by employing the screen printing method up to a position II on the first circuit pattern layer part 103 in a direction indicated by an arrow S, thereby forming a second insulating layer part 107b. At this time, the second insulating layer part 107b is formed on the first insulating layer part 107a so as to expose one part of the surface of the first insulating layer part 107a (a portion indicated by a) formed on each of the first circuit pattern layer part 103 and the second circuit pattern layer part 104. The resin paste is heated and dried, thereby forming the insulating layer 107 including the first insulating layer part 107a and the second insulating layer part 107b. As described above, the resin paste is applied in twice, thereby forming the insulating layer 107. At the position II, although a stair-like split-level portion is formed immediately after the application, a split-level portion having a smoothly inclined surface is formed after the heating- drying.

In the present invention, since the insulating layer 107 is formed as described above, the insulating layer 107 has a plurality of inclined end surfaces on the first circuit pattern layer part 103, specifically, an inclined end surface in the position I and an inclined end surface in the position II. Similarly, the insulating layer 107 has a plurality of inclined end surfaces on the second circuit pattern layer part 104.

As the method of applying the resin paste in twice, the following method may be employed. First, as shown in FIG. 9, the resin paste is applied by employing the screen printing method up to the position I on the first circuit pattern layer part 103 in the direction indicated by the arrow S, thereby forming the first insulating layer part 107a. Thereafter, as shown in FIG. 10, the resin paste is applied onto the first insulating layer part 107a by employing the screen printing method from the position II on the first circuit pattern layer part 103 in the direction indicated by the arrow R, thereby forming the second insulating layer part 107b.

In the conductive layer formation step shown in FIG. 3, as shown in FIG. 11, a silver paste is applied onto the insulating layer 107 by employing the screen printing method, and thereafter, the heating-drying is conducted, thereby forming the conductive layer 108.

In the antenna circuit constituent body for an IC card/tag according to the present invention, it is not required to subject metal foil, fixed onto the other surface side of the base material 200 separately, to the etching processing only for the purpose of forming a conductive layer as a bridge circuit pattern layer, thus allowing environmental load to be reduced.

In addition, since the insulating layer 107 has the plurality of inclined end surfaces on each of the first circuit pattern layer part 103 and second circuit pattern layer part 104, the inclination of the end part of the insulating layer 107 can be made gentle. Thus, a problem in that when the antenna circuit constituent body is conveyed after forming the conductive layer 108, cracks are caused in the conductive layer 108 and disconnection thereby occurs can be solved. As a result, it is made possible to enhance reliability of joining portions of both end portions of the antenna circuit pattern layer 100.

In the antenna circuit constituent body for an IC card/tag according to the present invention, it is preferable that the insulating layer 107 has the split-level portion on each of the first circuit pattern layer part 103 and second circuit pattern layer part 104, specifically, the split-level portion in the position II.

In the antenna circuit constituent body for an IC card/tag according to the present invention, it is preferable that the insulating layer 107 includes: the central portion (a portion constituted of the first insulating layer part 107a and the second insulating layer part 107b), having a relatively large thickness formed on the third circuit pattern layer part (one part of the plurality of linear pattern layers constituting the antenna coil part 101); and the both end portions (portions constituted of only the first insulating layer part 107a) each having a relatively small thickness formed on each of the first circuit pattern layer part 103 and second circuit pattern layer part 104.

Figure 12:
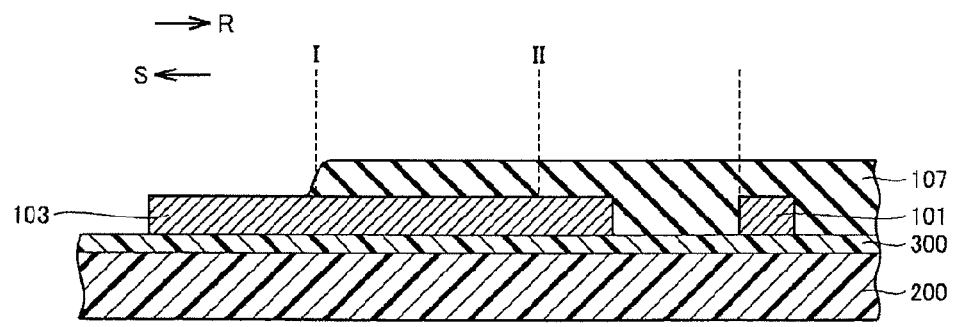
FIG. 12 is a partially enlarged cross-sectional view illustrating an application step for forming an insulating layer in the conventional method for manufacturing an antenna circuit constituent body for an IC card/tag.
Figure 13:
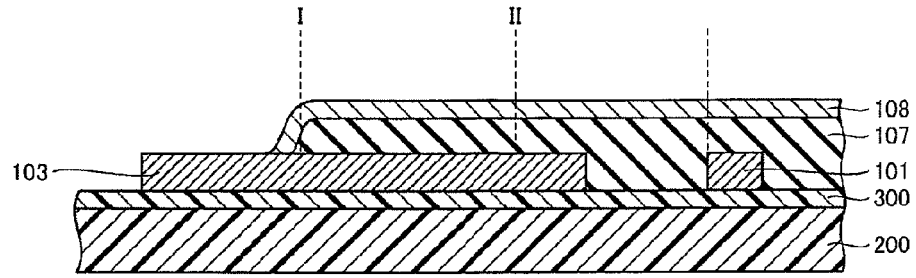
FIG. 13 is a partially enlarged cross-sectional view illustrating an application step for forming a conductive layer in the conventional method for manufacturing the antenna circuit constituent body for an IC card/tag.

In contrast to this, in the conventional insulating layer formation step and conductive layer formation step, first, as shown in FIG. 12, a resin paste is applied in once by employing a screen printing method from a position I on a first circuit pattern layer part 103 in a direction indicated by an arrow R or up to the position I in a direction indicated by an arrow S, and thereafter, heating-drying is conducted, thereby forming an insulating layer 107. The above-mentioned application of the resin paste may be conducted in twice. Next, as shown in FIG. 13, a silver paste is applied onto the insulating layer 107 by employing the screen printing method and thereafter, the heating-drying is conducted, thereby forming a conductive layer 108.

In the conventional insulating layer formation step, since the insulating layer 107 has a single inclined end surface on each of the first circuit pattern layer part 103 and the second circuit pattern layer part 104 (position I), an inclination of an end portion of the insulating layer 107 is steep. This may pose a problem in that when the antenna circuit constituent body is conveyed after forming the conductive layer 108, cracks are caused in the conductive layer 108 and disconnection thereby occurs. As a result, in terms of reliability, there is a problem.

As a method of forming the insulating layer 107 in the present invention, the screen printing method, an ink jet printing method, and the like are cited. Since the screen printing method allows a thickness necessary for the insulation to be easily formed and any shape to be easily formed, the screen printing method is suitably used.

In the both end portions, each having the relatively small thickness, of the insulating layer 107 (the portions constituted of only the first insulating layer part 107a) shown in FIG. 10, a preferable relationship of (a) and (t) is, with $\tan\theta=t/a$ expressed, $\pi/90(2°)\leq\theta\leq\pi/3(60°)$. In particular, it is more preferable that θ is within a range of $\pi/60(3°)\leq\theta\leq\pi/4(45°)$. It is preferable that a shortest distance (b) from the conducting part (antenna coil part 101) requiting the insulation up to the both end portions (portions constituted of only the first insulating layer part 107a), each having the relatively small thickness, of the insulating layer 107 is greater than or equal to 0.5 mm.

As the method of forming the conductive layer 108, although the screen printing method, the ink jet method, a flexo printing, and the like are cited, since the screen printing allows a thickness of a conductive body to be easily formed and any shape to be easily formed, the screen printing is suitably used.

Although the resist ink used in the manufacturing method according to the present invention is not particularly limited, it is preferable to use a ultraviolet cure resist ink whose main components are an acrylic monomer having at least one carboxyl group in a molecule and an alkali-soluble resin. Since this resist ink allows gravure printing to be conducted, has acid resistance, and can be easily peeled and removed by an alkali, this resist ink is suited to continuous mass production. By using this resist ink, the aluminum foil or the copper foil is subjected to the gravure printing with a predetermined circuit pattern, is cured by being irradiated with ultraviolet rays, and is subjected to acid etching of the aluminum foil or the copper foil in accordance with an ordinary method by using, for example, a ferric chloride or the like and to peeling and removal of the resist ink layer by using an alkali such as an sodium hydroxide, thereby allowing the circuit pattern layers to be formed.

As the acrylic monomer having at least one carboxyl group in a molecule, for example, 2-acryloyloxyethyl phthalic acid, 2-acryloyloxyethyl succinic acid, 2-acryloyloxyethyl hexahydrophthalic acid, 2-acryloyloxypropyl phthalic acid, 2-acryloyloxypropyl tetrahydro phthalic acid, 2-acryloyloxypropyl hexahydrophthalic acid, or the like is cited, and each of these acrylic monomers may be used alone or two or more of these acrylic monomers may be mixed to be used. As the above-mentioned alkali-soluble resin, for example, a styrene-maleic acid resin, a styrene-acrylic resin, a rosin-maleic acid, or the like is cited.

Beside the above-mentioned components, an ordinary monofunctional acrylic monomer, an ordinary polyfunctional acrylic monomer, and an ordinary prepolymer can be added to the resist ink to the extent that alkali peeling properties are not inhibited, and a photo polymerization initiator, a pigment, an additive agent, a solvent, and the like can be appropriately added thereto, thereby allowing the resist ink to be prepared. As the photo polymerization initiator, benzophenone, a derivative of the benzophenone, benzil, benzoin, alkyl ether of the benzil, alkyl ether of the benzoin, thioxanthone, a derivative of the thioxanthone, Lucirin PTO, IRGACURE manufactured by Ciba Specialty Chemicals Corporation, Esacure manufactured by Fratteli-Lamberti SpA, or the like is cited. As the pigment, a coloring pigment is added to allow the pattern to be easily viewable, and in addition, an extender such as silica, talc, clay, barium sulfate, and calcium carbonate can be used in combination. In particular, the silica is effective for prevention of blocking in a case where copper foil is to be rolled up with the ultraviolet cure resist ink remaining thereon. As the additive, there are a polymerization inhibitor such as 2-tertiary butyl hydroquinone, silicon, a fluorine compound, an antifoaming agent such as an acrylic-polymeric substance, and a leveling agent, which may be appropriately added as needed. As the solvent, ethyl acetate, ethanol, denatured alcohol, isopropyl alcohol, toluene, MEK, or the like is cited, and each of these solvents may be used alone or two or more of these solvents may be mixed to be used. It is preferable that after the gravure printing, the solvent is evaporated from the resist ink layer through hot air drying or the like.

EXAMPLE

As described below, specimens of antenna circuit constituent bodies of an example according to the present invention and the conventional example were prepared.

Example

As shown in FIG. 4, on one surface of a base material 200 having a thickness of 38 μm and formed of a PET film, rolled copper foil 110 having a thickness of 35 μm was bonded through employing a dry lamination method by using a polyurethane-based adhesive containing an epoxy resin, thereby preparing a laminated body. On the copper foil 110 of the laminated body obtained as described above, a printing pattern of an antenna circuit pattern layer 100 as shown in FIG. 1 was printed by using a resist ink having the below-shown composition and a Helio-Klischo-gravure printing plate. After the printing, irradiation was conducted for 15 seconds by using an ultraviolet ray lamp with an exposure dose of 480 W/cm², and the resist ink was thereby cured, thus forming a resist ink layer 400 as shown in FIG. 5.

The composition of the ink was as follows.

Beckacite J-896 (a rosin-maleic acid resin manufactured by DIC Corporation: 21 parts by weight, 2-acryloyl hexyethylhexa hydrophtalic acid: 25 parts by weigh, Unidic V-5510 (a mixture of a prepolymer and a monomer, manufactured by DIC Corporation): 8 parts by weight, IRGACURE 184: 3 parts by weight, Ethyl acetate: 28 parts by weight, Denatured alcohol: 12 parts by weight, Phthalocyanine blue: 1 part by weight, and Silica: 2 parts by weight.

By immersing the laminated body having the resist ink layer 400 formed thereon as described above in a ferric chloride aqueous solution of 42° Baume for 5 minutes at a temperature of 45° C., etching of the copper foil 110 was conducted, thereby forming the antenna circuit pattern layer 100 in accordance with a predetermined pattern. Thereafter, by immersing the laminated body in a 1% sodium hydroxide aqueous solution for 10 seconds at a temperature of 20° C., the resist ink layer 400 was peeled as shown in FIG. 7. The laminated body was dried by warm air having a temperature of 70° C.

In predetermined positions of the laminated body obtained as described above, or specifically, between a first circuit pattern layer part 103 and a second circuit pattern layer part 104 shown in FIG. 2, an insulating layer 107 and a conductive layer 108 were formed as shown in FIG. 8 and FIG. 3, thereby bringing the first circuit pattern layer part 103 and the second circuit pattern layer part 104 into conduction.

A polyester-based insulation ink (manufactured by JUJO CHEMICAL CO., LTD. with product number: AC3G) was printed by using a 150-mesh Tetron printing plate and thereafter, heating at a temperature of 150° C. was conducted for 30 minutes, thereby forming the insulating layer 107. The polyester-based insulation ink was printed by employing a screen printing method so as to have a thickness of 17 μm through conducting the application in twice as shown in FIG. 9 and FIG. 10. In FIG. 10, with $\tan\theta = t/a$ expressed, an angle of t/a was 7.5°.

A silver paste (manufactured by DuPont, with product number: 5029) was printed by using the 150-mesh Tetron printing plate and thereafter, heating was conducted at a temperature of 150° C. for 30 minutes, thereby forming the conductive layer 108. The silver paste was printed by employing a screen printing method so as to have a thickness of 17 μm by conducting the application in once as shown in FIG. 11.

As described above, the antenna circuit constituent body for an IC card/tag according to the present invention using the copper foil was prepared.

Conventional Example

The conventional antenna circuit constituent body for an IC card/tag was prepared in the same manner as in the example except that a polyester-based insulation ink for forming an insulating layer 107 was printed by employing a screen printing method so as to have a thickness of 34 μm through conducting the application in once as shown in FIG. 12.

Figure 14:
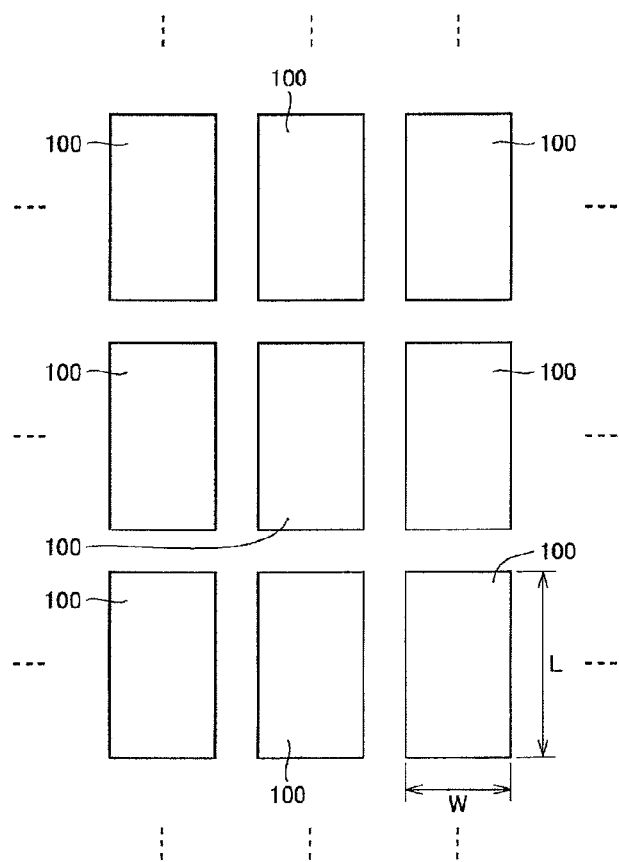
FIG. 14 is a plan view illustrating an array of a plurality of antenna circuit constituent bodies prepared on a surface of a belt-like resin film base material.

The antenna circuit constituent bodies of the example according to the present invention and the conventional example were formed by horizontally and vertically arraying continuously a multitude of antenna circuit pattern layers 100 on a surface of a belt-like base material at predetermined spacings as shown in FIG. 14. Each of the obtained antenna circuit pattern layers 100 had a width W of approximately 4.5 cm and a length L of approximately 7.5 cm.

(Evaluation Method)

Figure 15:
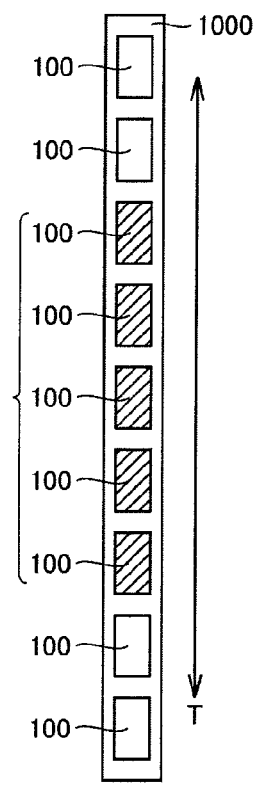
FIG. 15 is a plan view illustrating a specimen sheet obtained by cutting out one part of the plurality of antenna circuit constituent bodies prepared on the surface of a belt-like resin film base material.

From the belt-like body having the multitude of antenna circuit pattern layers 100 formed thereon as shown in FIG. 14, a specimen sheet 1000 was cut out so as to have nine antenna circuit pattern layers 100 longitudinally arranged in one column thereon as shown in FIG. 15. By using this specimen sheet 1000, the evaluation of the conductive layer 108 was conducted.

Figure 16:
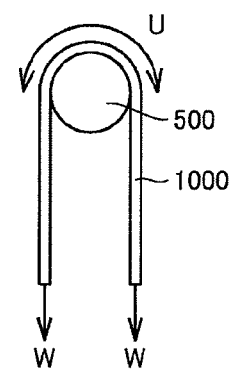
FIG. 16 is a diagram for describing a method of an evaluation of specimen sheets prepared in an example according to the present invention and a comparison example.

The specimen sheet 1000 was set so as to extend around a rotating roll 500 having a diameter of 20 mm in a direction indicated by an arrow T (FIG. 15) as shown in FIG. 16. A load W of 300g was applied to each end of the specimen sheet 1000, the specimen sheet 1000 was manually moved so as to perform reciprocation on the rotating roll 500 at 100 times.

Thereafter, with respect to four specimen sheets 1000 of each of the example and the conventional example, each of which underwent the above-mentioned test, a part of each of the conductive layers 108 in five antenna circuit pattern layers 100 (indicated by hatching) located in the central portion thereof as shown in FIG. 15 was visually observed and crack disconnection was visually checked. The number of checked specimens was 20 in each of the example and the conventional example.

As a result, in the example, there was no specimen which had the crack disconnection in the conductive layer 108. In the conventional example, it was confirmed that there were eight specimens, each of which had the crack disconnection in the conductive layer 108. It can be seen that the example according to the present invention allows reliability of the conductive layer 108 to be enhanced.

With respect to the 20 specimens in the example and the 12 specimens in the conventional example, each of which had no crack disconnection, an electric resistance between points P and Q shown in FIG. 2 was measured, and an average value was obtained. By employing this method, since an IC chip is not mounted on an IC chip mounting part 102 of an antenna circuit pattern layer 100 shown in FIG. 1, an electric resistance between contacting parts of the conductive layer 108 can be evaluated.

As a result, in the example, the electric resistance was 150 mΩ, and in the conventional example, the electric resistance was 2000 mΩ. It can be seen that the example according to the present invention can reduce the electric resistance between the contacting parts of the conductive layer 108.

The described embodiment and example are to be considered in all respects only as illustrative and not restrictive. It is intended that the scope of the invention is, therefore, indicated by the appended claims rather than the foregoing description of the embodiment and example and that all modifications and variations coming within the meaning and equivalency range of the appended claims are embraced within their scope.

Industrial Applicability

According to the present invention, in a manufacturing process for joining both end portions of an antenna circuit pattern layer, environmental load can be reduced and reliability of the joined portions of the both end portions of the antenna circuit pattern layer can be enhanced. Therefore, the present invention is applicable to a configuration and manufacture of the antenna circuit constituent body which constitutes an IC card, an IC tag, or the like.

Reference Signs List

100: antenna circuit pattern layer, 101: antenna coil part, 103: first circuit pattern layer part, 104: second circuit pattern layer part, 107: insulating layer, 107a: first insulating layer part, 107b: second insulating layer part, 108: conductive layer. 200: base material, 300: adhesive layer, 400: resist ink layer, 110: copper foil.

The invention claimed is:

1. An antenna circuit constituent body for an IC card/tag, comprising:
a base material formed of a resin film; and
an antenna circuit pattern layer formed on one surface of the base material and constituted of a conductive body including metal as a main component,
the antenna circuit pattern layer including: a first circuit pattern layer part and a second circuit pattern layer part electrically connected to each other; and a third circuit pattern layer part formed on one surface of a region of the base material between the first and second circuit pattern layer parts and, the antenna circuit constituent body for an IC card/tag further comprising:
an insulating layer formed so as to extend from an upper part of the first circuit pattern layer part, via an upper part of the third circuit pattern layer part, to an upper part of the second circuit pattern layer part; and
a conductive layer formed on the insulating layer so as to provide conduction between the first circuit pattern layer part and the second circuit pattern layer part the first circuit pattern layer part and the second circuit pattern layer part being connected to each other via the conductive layer, the insulating layer having a plurality of inclined end surfaces or a split-level portion on each of the first circuit pattern layer and the second circuit pattern layer part.

2. The antenna circuit constituent body for an IC card/tag according to claim 1, wherein the insulating layer includes: a central portion formed on the third circuit pattern layer part and having a relatively large thickness;

and both end portions formed respectively on the first circuit pattern layer part and the second circuit pattern layer part and each having a relatively small thickness.

3. The antenna circuit constituent body for an IC card/tag according to claim 1, wherein the insulating layer is formed of a polyester resin.

4. The antenna circuit constituent body for an IC card/tag according to claim 1, wherein the antenna circuit pattern layer is formed of copper foil, the antenna circuit pattern layer and the base material are thermally bonded with an adhesive layer interposed therebetween, and the conductive layer includes silver.

5. A method for manufacturing an antenna circuit constituent body for an IC card/tag, comprising the steps of:
   fixedly attaching metal foil on one surface of a base material formed of a resin film;
   printing on the metal foil a resist ink layer having a predetermined pattern;
   forming on the one surface of the base material an antenna circuit pattern layer through etching the metal foil by using the resist ink layer as a mask, the antenna circuit pattern layer including a first circuit pattern layer part and a second circuit pattern layer part electrically connected to each other and a third circuit pattern layer part formed on one surface of a region of the base material between the first and second circuit pattern layer parts;
   forming a first insulating layer part so as to extend from an upper part of the first circuit pattern layer part, via an upper part of the third circuit pattern layer part, to an upper part of the second circuit pattern layer part;
   forming a second insulating layer part on the first insulating layer part so as to expose one part of a surface of the first insulating layer part formed on each of the first circuit pattern layer part and the second circuit pattern layer part; and
   forming on the first and second insulating layer parts a conductive layer providing conduction between the first circuit pattern layer part and the second circuit pattern layer part, the first circuit pattern layer part and the second circuit pattern layer part being connected to each other via the conductive layer.

* * * * *